(12) United States Patent
Kim et al.

(10) Patent No.: US 7,079,057 B2
(45) Date of Patent: Jul. 18, 2006

(54) CONTEXT-BASED ADAPTIVE BINARY ARITHMETIC CODING METHOD AND APPARATUS

(75) Inventors: Doohyun Kim, Seoul (KR); Daesung Cho, Seoul (KR); Sangio Lee, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 11/177,416

(22) Filed: Jul. 11, 2005

(65) Prior Publication Data

US 2006/0028359 A1 Feb. 9, 2006

(30) Foreign Application Priority Data

Aug. 5, 2004 (KR) ...................... 10-2004-0061789

(51) Int. Cl.
*H03M 7/00* (2006.01)
(52) U.S. Cl. ........................... 341/107; 341/51; 341/52
(58) Field of Classification Search ................ 341/107, 341/50, 106, 51, 52
See application file for complete search history.

(56) References Cited

U.S. PATENT DOCUMENTS

| | | | | |
|---|---|---|---|---|
| 5,867,600 | A * | 2/1999 | Hongu | 382/247 |
| 6,181,435 | B1 * | 1/2001 | Onodera | 358/1.14 |
| 6,489,903 | B1 * | 12/2002 | Kimura et al. | 341/107 |
| 6,894,628 | B1 * | 5/2005 | Marpe et al. | 341/107 |
| 2003/0108125 | A1 * | 6/2003 | Dombek | 375/324 |

OTHER PUBLICATIONS

Detlev Marpe, et al., "Context-Based Adaptive Binary Arithmetic Coding in the H.264/AVC Video Compression Standard", IEEE Transactions on Circuits and Systems for Video Technology, vol. 13, No. 7, Jul. 2003 (pp. 620-636).

(Continued)

*Primary Examiner*—Peguy JeanPierre
(74) *Attorney, Agent, or Firm*—Staas & Halsey LLP

(57) ABSTRACT

There are provided a context-based adaptive binary arithmetic decoding method and apparatus. The context-based adaptive binary arithmetic decoding apparatus includes: a context extractor extracting a plurality of contexts from a storage unit storing contexts each including a state value for probability characteristic; a first ROM table storing current probability information so that a current binary symbol of the bit stream is decoded according to a state value of each context; a second ROM table storing predicted probability information so that a next binary symbol of the bit stream is decoded according to a state value of each context; a general mode arithmetic decoder, which performs pipeline processing, loading current probability information from the first ROM table on the basis of a current state value of a context extracted from the context extractor to decode a first binary symbol, and loading predicted probability information from the second ROM table to decode a next remaining binary symbol while decoding the remaining binary symbols; and a bypass mode arithmetic decoder, including a plurality of calculators for parallel processing, simultaneously decoding a plurality of corresponding binary symbols of the bit stream, to perform arithmetic decoding on the remaining symbols if a predetermined condition is satisfied while the general mode arithmetic decoder performs arithmetic decoding on the corresponding symbols of the bit stream. Therefore, by implementing a hardware suitable for context-based adaptive binary arithmetic decoding, it is possible to enhance a decoding speed.

20 Claims, 9 Drawing Sheets

OTHER PUBLICATIONS

Masaya Tarui, et al., "High-Speed Implementation of JBIG Arithmetic Coder", 1999 IEEE Tencon (pp. 1291-1294), no month.

"Draft Text of Final Draft International Standard for Advanced Video Coding" (ITU-T Rec. H.264 / ISO/IEC 14496-10 AVC) published by the International Organisation for Standardisation, Organisation Internationale De Normalisation, ISO/IEC JTC 1/SC 29/WG 11, Coding of Moving Pictures and Audio, XP-001091555, N5555, Pattaya, Mar. 2003 (pp. 1-226).

European Search Report dated Nov. 3, 2005.

* cited by examiner

FIG. 10

| CURRENT STATE (ADDRESS) | CURRENT LPS RANGE$_1$ | RENORM FACTOR | CURRENT LPS RANGE$_2$ | RENORM FACTOR | CURRENT LPS RANGE$_3$ | RENORM FACTOR | CURRENT LPS RANGE$_4$ | RENORM FACTOR |
|---|---|---|---|---|---|---|---|---|
| | 8 BIT | 3 BIT | 8 BIT | 3 BIT | 8 BIT | 3 BIT | 8 BIT | 3 BIT |

CONTEXT-BASED ADAPTIVE BINARY ARITHMETIC CODING METHOD AND APPARATUS

CROSS-REFERENCE TO RELATED APPLICATIONS

This application claims the priority of Korean Patent Application No. 2004-61789, filed on Aug. 5, 2004, in the Korean Intellectual Property Office, the disclosure of which is incorporated herein in its entirety by reference.

BACKGROUND OF THE INVENTION

1. Field of the Invention

The present invention relates to a context-based adaptive binary arithmetic decoding method and apparatus, and more particularly, to a method and apparatus for implementing in hardware context-based adaptive arithmetic decoding as one of entropy coding techniques in an image decoding apparatus.

2. Description of the Related Art

Arithmetic coding is known as one of most effective entropy coding technologies. However, since the arithmetic coding has high complexity and requires complicated hardware, it has not been used for image compression. However, recently, a H.264/MPEG4 pt. 10 AVC codec developed by Joint Video Team (JVT) of ISO/IEC MPEG and ITU-T VCEG adapts the arithmetic coding to enhance coding efficiency (see "Text of ISO/IEC FDIS 14496-10: Information Technology-Coding of audio-visual objects—Part 10: Advanced Video Coding", ISO/IEC JTC 1/SC 29/WG 11, N5555, March, 2003). An arithmetic decoder for implementing the arithmetic coding based on the H.264/MPEG4 pt. 10 AVC codec is a context-based adaptive binary arithmetic decoder (for example, H.264/MPEG4 pt. 10 AVC decoder). The H.264/MPEG4 pt. 10 AVC decoder predicts probability values according to contexts and performs arithmetic decoding using a QM coder, in the same manner as that used in a conventional JBIG (see "Text of ITU-T Recommendation T. 82 (1993)|ISO/IEC 11544: Information technology—Coded representation of picture and audio information-Progressive bi-level image compression").

FIG. 1 is a block diagram schematically showing an encoder (H.264/AVC encoder) for H.264/AVC context-based adaptive binary arithmetic encoding.

Referring to FIG. 1, a binarization unit 120 binarizes an input value according to a syntax signal received from a syntax unit 110, thus creating a binary value. Here, the syntax signal may be a motion vector flag, a block mode flag, a residue flag, etc. The motion vector flag, the block mode flag, and the residue flag are classified according to the types of signals to be decoded by the syntax signal. That is, if a motion vector flag is input to the binarization unit 120, a motion vector value is decoded, if a block mode flag is input to the binarization unit 120, a block mode value is decoded, and if a residue flag is input to the binarization unit 120, a residue value is decoded.

Here, a value input to the binarization unit 120 is a signal sampled and quantized from an image signal. A context unit 140 receives a model signal for initializing a context from a model unit 130, receives the syntax signal from the syntax unit 110, selects a corresponding context, and then outputs the selected context to the QM coder 150. The QM coder 150 performs arithmetic encoding on a value received from the binarization unit 120 on the basis of the context received from the context unit 140. Each context contains a state value to encode a corresponding binarization value. The QM coder 150 loads the state value and reads a probability value corresponding to the state value from a table, thus performing arithmetic encoding. A bit stream subjected to the arithmetic encoding by the QM coder 150 is transmitted to a decoder.

FIG. 2 is a block diagram schematically showing a decoder (H.264/AVC decoder) for H.264/AVC context-based adaptive binary arithmetic decoding.

Referring to FIG. 2, a context unit 210 receives the model signal (initial model signal) through the bit stream received from the H.254/AVC encoder and receives a syntax information signal from the syntax unit 230, thus extracting a context according to the syntax signal. A QM coder 220 performs arithmetic decoding on the bit stream received from the encoder on the basis of the context extracted by the context unit 210. An inverse binarization unit 240 receives the syntax information signal from the syntax unit 230 and inverse-binarizes a binary value output from the QM coder 220 on the basis of the syntax information signal, thus creating and outputting a value. The value output from the inverse binarization unit 240 is subjected to inverse-quantization and inverse-transform and then output as an original image signal. The QM coder 220 is a specific QM coder suitable for the H.264/AVC decoder.

FIG. 3 is a block diagram provided for explaining in detail the operation of the context unit 210 and the QM coder 220 of FIG. 2.

The configuration of FIG. 3, which includes a context unit 310, a general mode arithmetic decoder 320, and a bypass mode arithmetic decoder 330, is aimed to reduce complexity of arithmetic decoding.

The context unit 310, which is a device suitable for use in a context-based technique, extracts different contexts according to the states of adjacent symbols so that probability values can be adaptively obtained when given symbols are decoded, thereby increasing compression efficiency. A context extracted from the context unit 310 uses the number of pre-decoded specific residues. An extracted context consists of two factors of a state value and a MPS (Most Probable Symbol), which represent information regarding probability characteristic. The context unit 310 storing a plurality of contexts extracts a corresponding context and outputs it to the general mode arithmetic decoder 320.

The general mode arithmetic decoder 320 performs arithmetic decoding on the basis of a context output from the context unit 310. A decoder (H.264/MPEG-4 pt. 10 AVC decoder) based on the H.264/MPEG-4 pt. 10 AVC codec performs both general mode arithmetic decoding and bypass mode arithmetic decoding. For that, the bypass mode arithmetic decoder 330 is newly provided in addition to the general mode arithmetic decoder 320 having the same configuration as the conventional QM coder, differently from the conventional arithmetic decoder. In the H.264/MPEG-4 pt. 10 AVC decoder, in order to reduce complexity, a 4×64 table in which probability values for a LPS (Least Probable Symbol) are quantized, is used. The 4×64 table will be described in detail later.

Meanwhile, if a probability value for a MPS is equal to that for a LPS, decoding by the general mode arithmetic decoder 320 is impossible. In this case, the bypass mode arithmetic decoder 330 is used. A bypass mode performed by the bypass mode arithmetic decoder 330 is applied when a probability value for a MPS is equal to that for a LPS and when a residue value is larger than 13. When a residue value is larger than 13, the general mode arithmetic decoder 320 controls a switch 340 to operate the bypass mode arithmetic decoder 330. In detail, the general mode arithmetic decoder 330 counts the number of symbols to be decoded, determines whether a residue value is larger than 13, and controls the switch 340 to operate the bypass mode arithmetic decoder 330 if the residue value is larger than 13.

Since the H.264/MPEG-4 pt. 10 AVC decoder described above maps a symbol to a binary value and decodes the binary value, many operations must be performed to obtain a symbol value. For example, assume that a binary value corresponding to a residue value 4 is '11110'. In this case, in the conventional arithmetic decoder, since one probability value is given to the residue value 4, one decoding operation is performed to obtain a result value. However, in the H.264/MPEG-4 pt. 10 AVC decoder, since respective figures of the binary value '11110' are decoded, five arithmetic decoding operations must be performed to obtain a residue value 4. The H.264/MPEG-4 pt. 10 AVC decoder performs no muliplication when decoding the binary value, thereby reducing complexity. However, since the H.264/MPEG-4 pt. 10 AVC decoder performs decoding operations in units of bits, it can not efficiently reduce operation complexity.

Also, the H.264/MPEG-4 pt. 10 AVC decoder has a similar basic algorithm with the conventional JBIG QM coder. However, in the H.264/MPEG-4 pt. 10 AVC decoder, many corrections and complements have been applied on a process of excluding multiplication for reducing complexity, compared with the conventional JBIG QM coder. Primarily, the H.264/MPEG-4 pt. 10 AVC decoder decides a context using the number of previously decoded specific residue values instead of information for adjacent blocks. Secondarily, the H.264/MPEG-4 pt. 10 AVC decoder has two modes of a general mode and a bypass mode. The H.264/MPEG-4 pt. 10 AVC decoder quantizes predicted probability values in order to reduce complexity when probability values are predicted, differently from the conventional arithmetic decoder (for example, JBIG QM coder). However, it is still difficult to hardwarily implement a H.264/MPEG-4 pt. 10 AVC decoder having both a general mode and a bypass mode, using an existing hardware.

SUMMARY OF THE INVENTION

Additional aspects and/or advantages of the invention will be set forth in part in the description which follows and, in part, will be apparent from the description, or may be learned by practice of the invention.

The present invention provides a context-based adaptive binary arithmetic decoding apparatus suitable for a H.264/MPEG-4 pt. 10 AVC codec, and a context-based adaptive binary arithmetic decoding method which performs pipeline processing in a general mode and performs parallel processing in a bypass mode in order to increase operation speed.

According to an aspect of the present invention, there is provided a context-based adaptive binary arithmetic decoding apparatus for decoding a bit stream generated by arithmetic encoding, including: a context extractor extracting a plurality of contexts from a storage unit storing contexts each including a state value for probability characteristic; a first ROM table storing current probability information so that a current binary symbol of the bit stream is decoded according to a state value of each context; a second ROM table storing predicted probability information so that a next binary symbol of the bit stream is decoded according to a state value of each context; a general mode arithmetic decoder, which performs pipeline processing, loading current probability information from the first ROM table on the basis of a current state value of a context extracted from the context extractor to decode a first binary symbol, and loading predicted probability information from the second ROM table to decode a next remaining binary symbol while decoding the remaining binary symbols; and a bypass mode arithmetic decoder, including a plurality of calculators for parallel processing, simultaneously decoding a plurality of corresponding binary symbols of the bit stream, to perform arithmetic decoding on the remaining symbols if a predetermined condition is satisfied while the general mode arithmetic decoder performs arithmetic decoding on the corresponding symbols of the bit stream.

According to another aspect of the present invention, there is provided a context-based adaptive binary arithmetic decoding method for decoding a bit stream generated by arithmetic encoding, including: loading a plurality of contexts each including a state value for probability characteristic; loading corresponding current probability information from a first ROM table storing current probability information to decode a first binary symbol of the bit stream according to a state value of each of the loaded contexts; loading corresponding predicted probability information from a second ROM table storing predicted probability information to decode a next binary symbol of the bit stream according to a loaded state value; decoding a first binary symbol on the basis of the current probability information loaded from the first ROM table and loading predicted probability information from the second ROM table to decode next remaining binary symbols while decoding current remaining binary symbols; determining whether a binary value of a decoded symbol of the bit stream satisfies a predetermined condition while decoding the first binary symbol; if it is determined that the current binary symbol of the bit stream satisfies the predetermined condition, simultaneously decoding a plurality of non-decoded binary symbols among binary symbols of the bit stream by a plurality of calculators and calculating a time of when a binary symbol of the bit stream is first output as a LPS; and after the binary symbol of the bit stream is first output as the LPS, decoding corresponding non-decoded remaining symbols.

According to another aspect, there is provided an apparatus for implementing context-based adaptive arithmetic decoding, including: a storage unit storing contexts, each context including a state value for probability characteristic; a context extractor extracting contexts from the storage unit; a first ROM table storing current probability information; a second ROM table storing predicted probability information; a general mode arithmetic decoder, which performs pipeline processing, loading current probability information from the first ROM table and loading predicted probability information from the second ROM table; a bypass mode arithmetic decoder, including a plurality of calculators for parallel processing, simultaneously decoding a plurality of corresponding binary symbols of the bit stream, to perform arithmetic decoding on the remaining symbols; and a level counter receiving values from the general mode arithmetic decoding unit and outputting a level counter signal.

Further, the context extractor loads the contexts stored in the storage unit, receives the level counter signal from the level counter, and extracts a predetermined context according to the level counter signal.

According to another aspect of the invention, the present invention can also be embodied as computer readable code on a computer readable recording medium.

BRIEF DESCRIPTION OF THE DRAWINGS

The above and other features and advantages of the present invention will become more apparent by describing in detail exemplary embodiments thereof with reference to the attached drawings in which:

FIG. 10 illustrates a ROM table for loading initial data, according to an embodiment of the present invention.

DETAILED DESCRIPTION OF THE PREFERRED EMBODIMENTS

Hereinafter, embodiments of the present invention will be described in detail with reference to the appended drawings.

Figure 1:
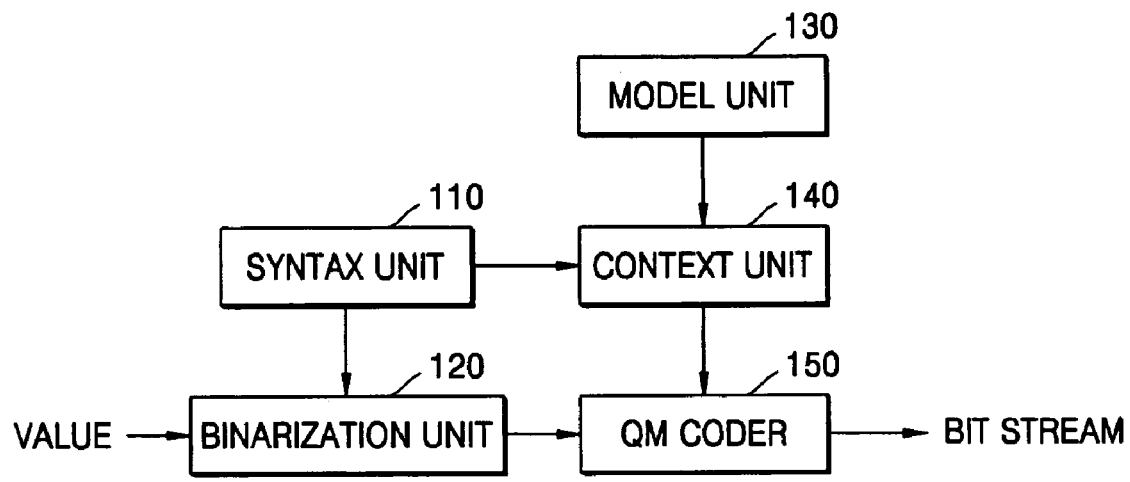
FIG. 1 is a block diagram showing an encoder for H.264/AVC context-based adaptive binary arithmetic encoding.
Figure 2:
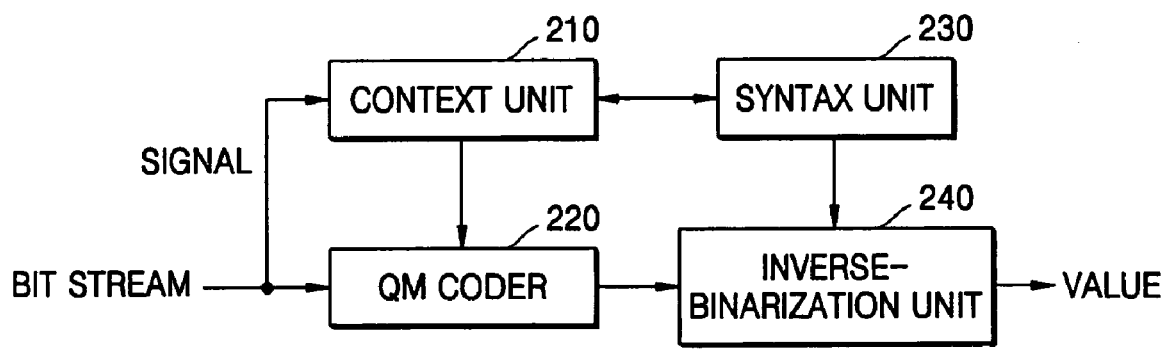
FIG. 2 is a block diagram showing a decoder for H.264/AVC context-based adaptive binary arithmetic decoding.
Figure 3:
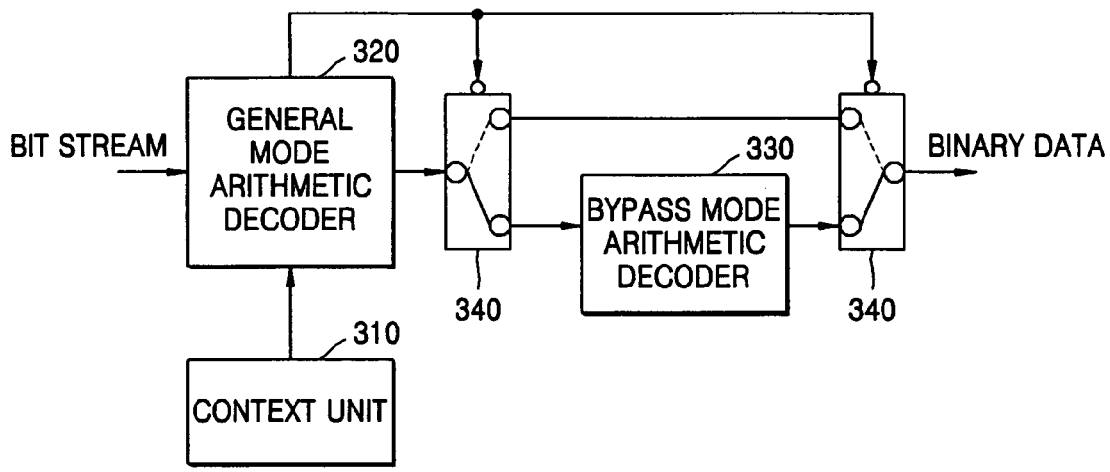
FIG. 3 is a block diagram provided for explaining in detail the operation of the context unit and the QM decoder shown in FIG. 2.
Figure 4:
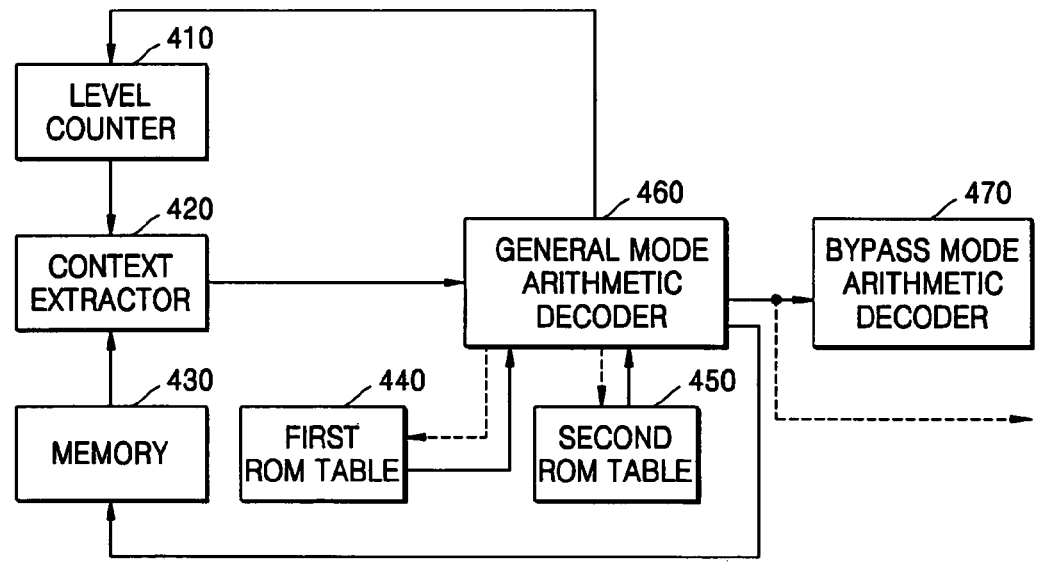
FIG. 4 is a block diagram of a context-based adaptive binary arithmetic decoder according to an embodiment of the present invention.

FIG. 4 is a block diagram of a context-based adaptive binary arithmetic decoder according to an embodiment of the present invention.

FIG. 4 shows an arithmetic decoder (hereinafter, referred to as H.264/MPEG-4 pt. 10 AVC decoder) based on a H.264/MPEG-4 pt. 10 AVC codec, as a context-based adaptive binary arithmetic decoder. The H.264/MPEG pt. 10 AVC decoder uses 10 contexts in order to decode residue values. Each context consists of two factors of a state value and a MPS (Most Probable Symbol), which represent probability characteristic information. Since each of the contexts stores a 6-bit state value and a 1-bit MPS, a total of 70 bits are stored in a memory 430.

First, a context extractor 420 loads contexts from the memory 430. In initial decoding, 10 contexts are loaded in advance to the context extractor 420 and then stored in corresponding registers of a general mode arithmetic decoder 460 until all symbols belonging to a current block are decoded. After all the symbols belonging to the current block are decoded, the general mode arithmetic decoder 460 re-writes the changed 10 contexts in the memory 430.

In detail, the context extractor 420 loads the 10 initial contexts from the memory 430 and extracts a corresponding context on the basis of previously decoded residue values. At this time, the context extractor 420 extracts a different context for a residue value according to the number of previously decoded residue absolute values, that is, according to when the number of previously decoded residue absolute values is 1 and when the number of previously decoded residue absolute values is more than 1. Accordingly, a device is needed for counting previously decoded residue absolute values. In the present invention, a level counter 410 is provided as such a counting device. After a context is extracted from the context extractor 420, a general mode arithmetic decoder 460 receives the extracted context and loads an actual probability value from first and second ROM tables 440 and 450 according to the context. Each context basically includes a state value indicating which one of the LPS probability values to use constructing a 4×64 table.

To load an actual probability value corresponding to a context, in the present invention, two tables are used: one is a first ROM table 440 in which a probability value for a current state value is quantized and the other is a second ROM table 450 in which a pre-predicted probability value is quantized. The two tables, that is, the first and second ROM tables 440 and 450 are used to reduce unnecessary memory consumption, considering the fact that an initial probability value for a received block is loaded from the first ROM table 440 in initial decoding and the next probability values are loaded from the second ROM table 450. As such, if an actual probability value is loaded according to a state value of the context, the general mode arithmetic decoder 460 performs arithmetic decoding (general mode arithmetic decoding) on the received block on the basis of the actual probability value.

At this time, the general mode arithmetic decoder 460 performs pipeline processing of loading a next probability value from the second ROM table 450 on the basis of a current state value, while performing the general mode arithmetic decoding. Since the second ROM table 450 stores all next probability values capable of being output according to the current state value, it is possible to load a next probability value through a data loading unit 532 (see FIG. 5) using the current state value.

In the present invention, since a portion for predicting a probability value of a symbol and a portion for outputting binary data on the basis of the predicted probability value construct a pipeline processing structure, pipeline processing of in advance loading predicted probability information for a next symbol from the second ROM table 450 and simultaneously performing decoding on the basis of the predicted probability information, can be performed. In the pipeline processing structure, since two different jobs can be simultaneously performed during a predetermined clock cycle, it is possible to quickly perform calculations.

After the general mode arithmetic decoding is complete, bypass mode arithmetic decoding is performed by a bypass mode arithmetic decoder 470 under a predetermined condition. In the bypass mode decoding, no context information is required and also loading probability values from the ROM table is no longer required. If a probability value that a symbol to be decoded is a MPS or LPS, is 0.5, parallel processing of simultaneously decoding a plurality of symbols by generalizing values capable of being output using the characteristic of binary codes to be mapped, is performed. As such, by simultaneously processing a plurality of symbols, a processing speed can be enhanced.

Figure 5:
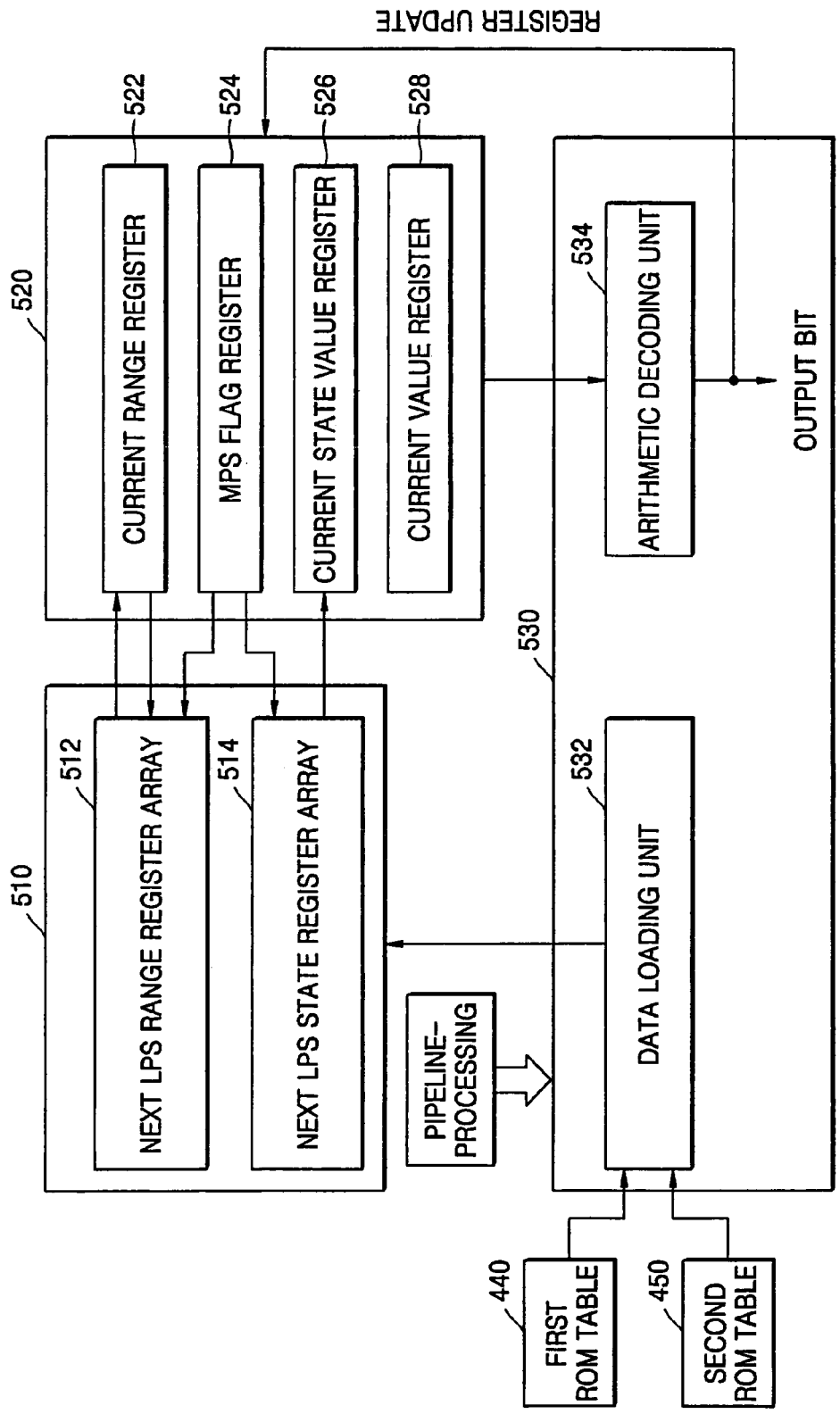
FIG. 5 shows the internal configuration of the general mode arithmetic decoder shown in FIG. 4.

FIG. 5 shows the internal configuration of the general mode arithmetic decoder 460 shown in FIG. 4.

Referring to FIG. 5, the general mode arithmetic decoder 460 includes a predicted probability information register array unit 510, a current probability information register unit 520, and a data loading/arithmetic decoding unit 530. First and second ROM tables 440 and 450 shown in FIG. 5 represent the first and second ROM tables 440 and 450 shown in FIG. 4.

The data loading/arithmetic decoding unit 530 includes a data loading unit 532 and an arithmetic decoding unit 534, which construct a pipeline processing structure allowing simultaneous operations.

The data loading unit 532 loads a next LPS probability value and a next LPS state value from the second ROM table 450 and transmits them to the predicted probability information register array unit 510.

The predicted probability information register array unit 510 includes a next LPS range register array 512 storing next LPS probability values and a next LPS state register array 514 storing next LPS state values. The next LPS range register array 512 and the next LPS state register array 514 store probability information for a next symbol to be decoded.

The current probability information register unit 520 includes a current range register 522 storing a current probability value, a MPS flag register 524 storing information indicating whether a decoded symbol is a MPS or a LPS, a current state value register 526 storing a current state value, and a current value register 528 storing a value of symbols decoded up-to-now. Here, the value for symbols decoded up-to-now means a ratio of the number of LPSs or MPSs to the number of symbols decoded up-to-now.

After a current symbol is decoded, the current range register 522 loads a next LPS probability value from the next LPS range register array 512 and stores it therein in order to decode a next symbol.

The MPS flag register 524 determines whether the currently decoded symbol is a MPS or a LPS on the basis of value information of the decoded symbols stored in the current value register 528, and stores the determined result.

The arithmetic decoding unit 534 receives a current probability value from the current range register 522 and performs arithmetic decoding and renormalization on the current probability value, thereby decoding a binary value. Here, the renormalization is to double the current probability value and current range when the current range becomes smaller than a half of a predetermined value and read the bit stream in a unit of 1 bit whenever the current probability value is doubled until the current range is larger than the predetermined value.

The next LPS range register array 512 and the current range register 522, which are organically connected to each other, receive or transmit updated values from/to each other, thereby influencing each other. Also, the predicted probability information register array unit 510 and the MPS flag register 524 are organically connected to each other, so as to receive/transmit data from/to each other.

Figure 6:
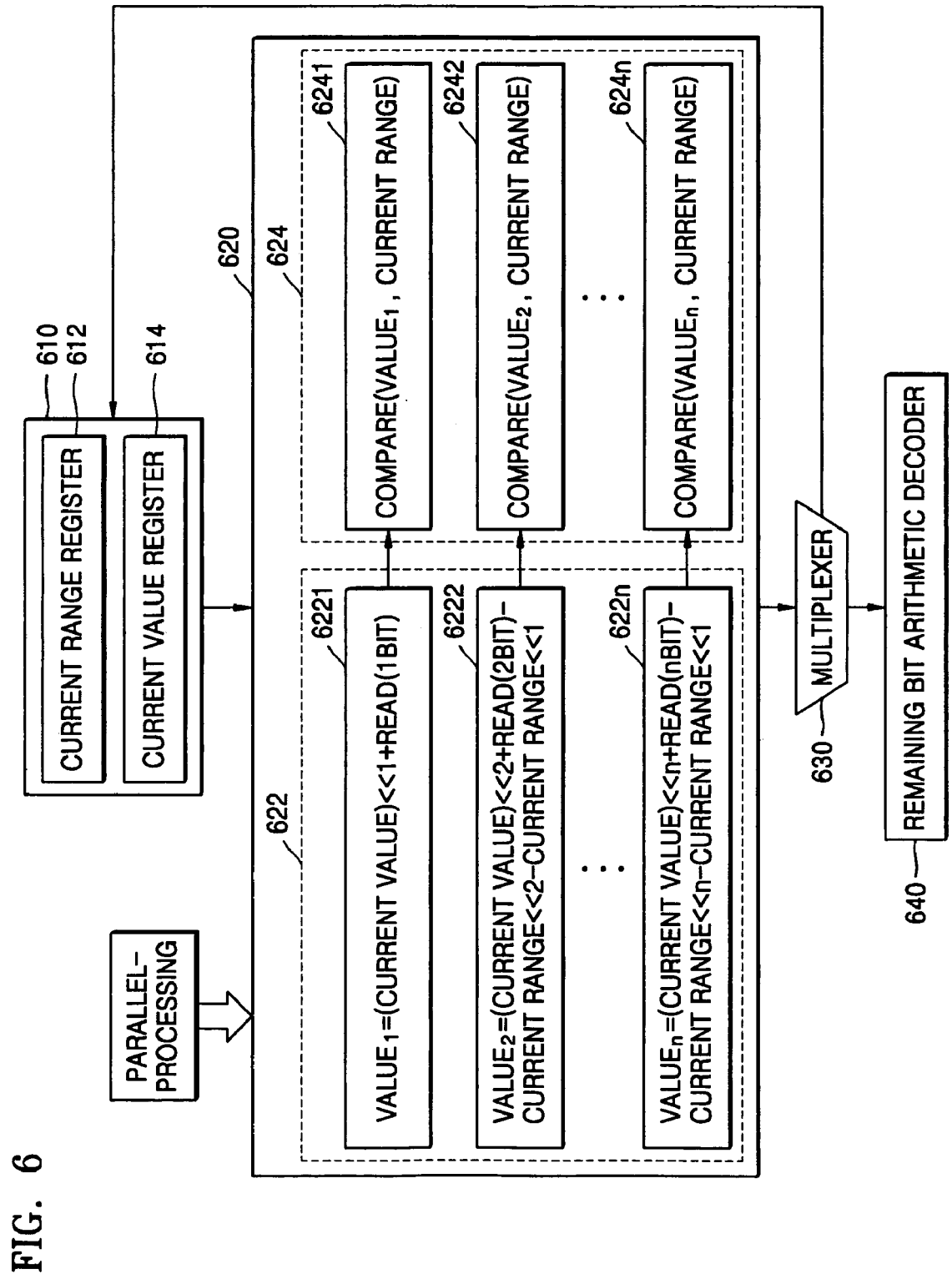
FIG. 6 shows the internal configuration of a bypass mode arithmetic decoder shown in FIG. 4.

FIG. 6 is a block diagram showing the internal configuration of the bypass mode arithmetic decoder 470 shown in FIG. 4.

Referring to FIG. 6, the bypass mode arithmetic decoder 470 includes a current probability value register 610 storing current probability information, a parallel arithmetic decoder 620 for performing parallel arithmetic decoding, a multiplexer 630 for deciding whether to use which one of values calculated by the parallel arithmetic decoder 620, and a remaining bit arithmetic decoder 640 for performing arithmetic decoding on remaining bits non-decoded by the parallel arithmetic decoder 620.

The current probability value register 610 includes a current range register 612 storing a current probability value and a current value register 614 storing a current value. The current range register 612 and the current value register 614 output a current probability value and a current value to the parallel arithmetic decoder 620, respectively.

The parallel arithmetic decoder 620 includes a value calculation unit 622 and a comparing unit 624. The value calculation unit 622 in advance calculates a value and the comparing unit 624 receives the calculated value from the value calculation unit 622 and compares it with a current probability value.

The value calculation unit 622 can include n calculators. In FIG. 6, the value calculation unit 622 includes a first value calculator 6221, a second value calculator 6222, ..., a n-th value calculator 622n. Here, the number of used value calculators may be different according to a system.

The comparing unit 624 includes a first comparator 6241 for comparing a first value calculated by the first value calculator 6221 with the current probability value to generate a first prediction value, a second comparator 6242 for comparing a second value calculated by the second value calculator 6222 with the current probability value to generate a second prediction value, ..., a n-th comparator 624n for comparing a n-th value calculated by the n-th calculator 622n with the current probability value to generate a n-th prediction value. The comparing unit 624 performs arithmetic decoding, thus determining whether a symbol to be decoded is a MPS or a LPS through the comparisons.

The multiplexer 630 decides whether to use which one of values arithmetically-decoded by the parallel arithmetic decoder 620 and outputs the decided result as a decision signal to the current probability value register 610 and the remaining bit arithmetic decoder 640.

The remaining bit arithmetic decoder 640 sequentially arithmetically-decodes the remaining bits undecoded by the parallel arithmetic decoder 620, in units of bits.

Figure 7:
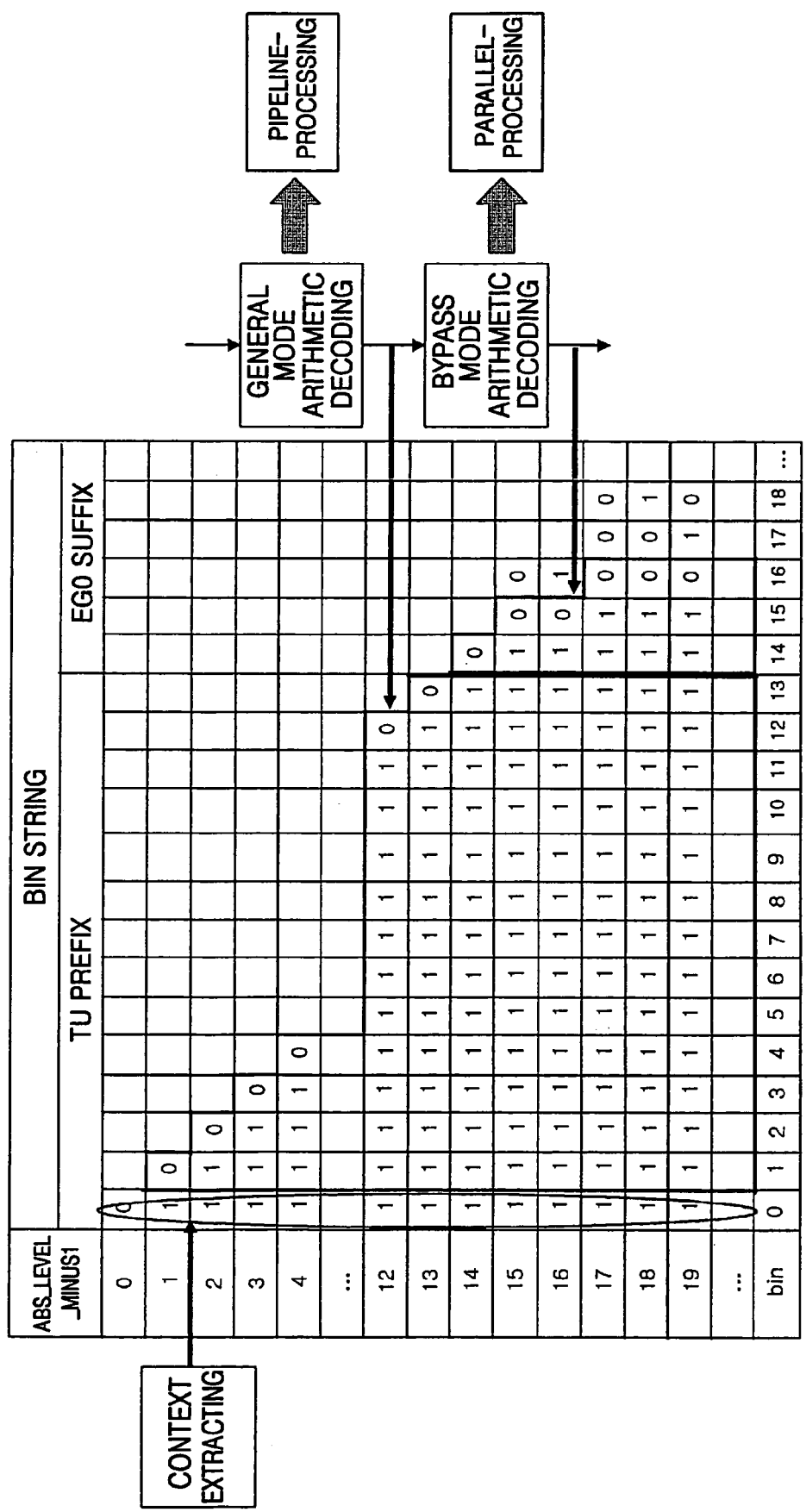
FIG. 7 illustrates a binarization code table for residue values, according to an embodiment of the present invention.

FIG. 7 shows a binarization code table for residue values, according to an embodiment of the present invention.

Referring to FIG. 7, the binarization code table consists of TU (Truncation Unary) codes and EG0 (Exponent Golomb Zero) codes.

Here, the binarization code table includes both a general mode and a bypass mode. If a residue value is smaller than 14, a corresponding binary value is mapped to a TU code in which '1' successively appears and '0' appears at a final location. However, if a residue value is equal to or larger than 14, a corresponding binary value is mapped to a TU code up to 13 and to an EG0 code from 14. A H.264/MPEG-4 pt. 10 AVC codec arithmetic decoder defines arithmetic decoding in a bypass mode, differently from arithmetic decoding in a general mode. The TU code is used for decoding in the general mode and the EG0 code is used for decoding in the bypass mode. In the present invention, pipeline decoding is performed in the general mode and parallel decoding is performed in the bypass mode.

In the above-described embodiment, 10 contexts are assigned to each residue value. 5 contexts of the 10 contexts are used to decode a first binary value and the remaining 5 contexts are used to decode the remaining binary values except for the first binary value.

When a context for the first binary value is selected, if the number of previously decoded residue values larger than 1 is one or more, a context 0 is used, otherwise, a context value corresponding to a value obtained by adding 1 to the number of previously decoded residue values corresponding to 1 is used. Here, since the number of the contexts is maximally 5, a context 4 is used if the value is larger than 4.

When contexts for the remaining binary values are selected, a context corresponding to the number of previously decoded residue values larger than 1, is used as it is. Likewise, since the number of contexts is limited to 5, a context 4 is used if the value is larger than 4. Accordingly, if the first binary value is decoded, contexts for a next residue symbol can be calculated.

In the table of FIG. 7, if the first binary value is 0, a current residue value is 1. If the first binary value is 1, a current residue value is larger than 1. Therefore, if a first binary value is output to the level counter 410 of FIG. 4, the number of residues equal to 1 and the number of residues larger than 1 are counted and the context extractor 420 of FIG. 4 can obtain contexts for a next residue value on the basis of the count information.

Figure 8:
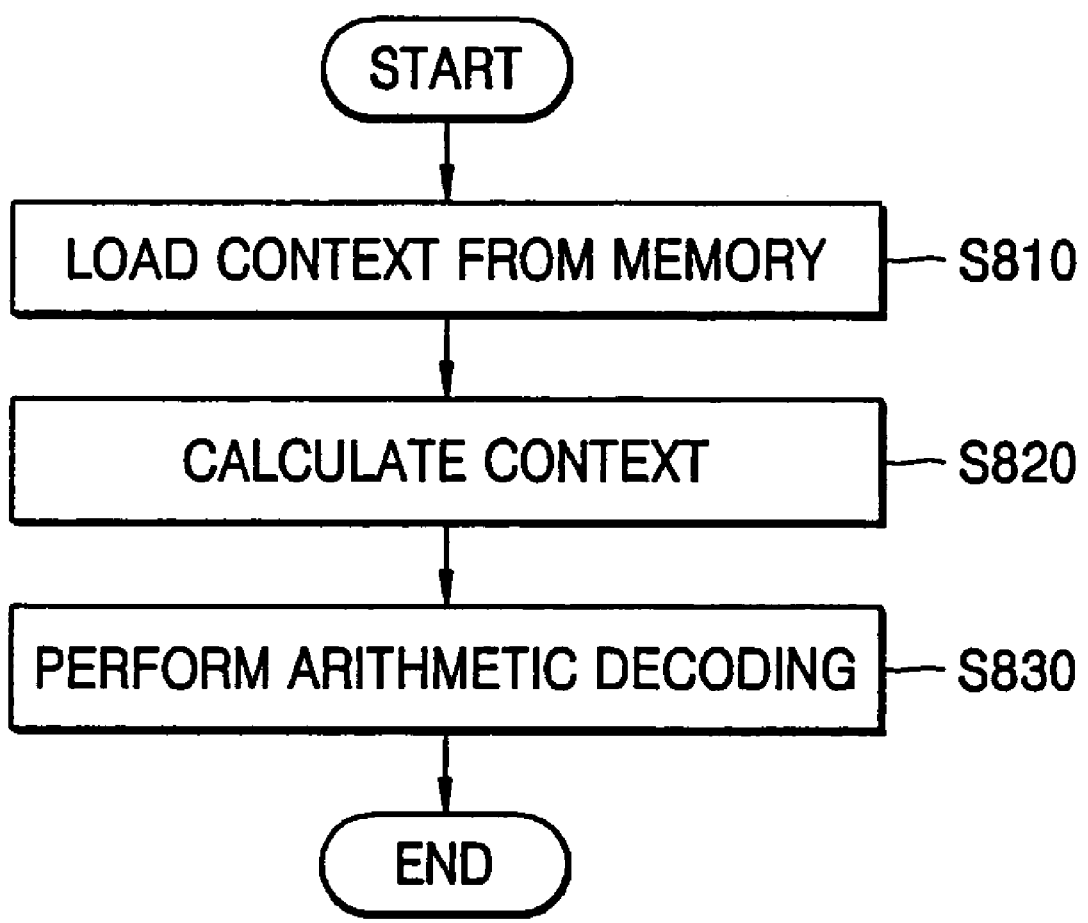
FIG. 8 is a flowchart illustrating a context-based adaptive binary arithmetic decoding method according to an embodiment of the present invention.

FIG. 8 is a flowchart illustrating a context-based adaptive binary arithmetic decoding method according to an embodiment of the present invention. The context-based adaptive binary arithmetic decoding method is described with reference to FIGS. 4, 7, and 8 below.

First, contexts are loaded to the context extractor 420 of FIG. 4 from the memory 430 of FIG. 4 (operation S810).

Then, one among the loaded contexts is extracted through a predetermined calculation by the context extractor 420 (operation S820).

Successively, arithmetic decoding is performed on the basis of the context extracted in operation S820 (operation S830). The first and second ROM tables 440 and 450 shown in FIG. 4 are used for the arithmetic decoding.

Figure 9:
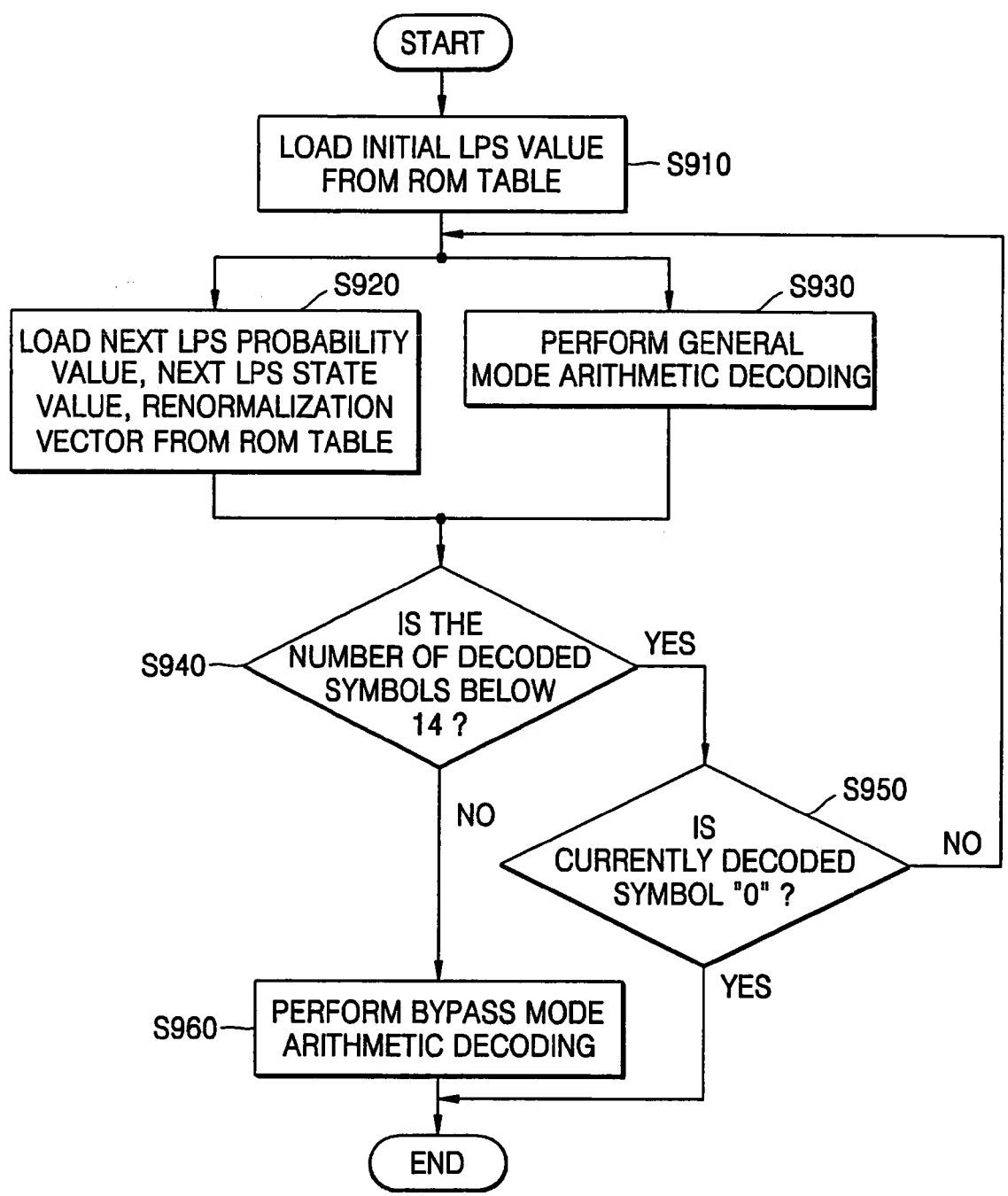
FIG. 9 is a flowchart illustrating an application example of the context-based adaptive binary arithmetic decoding method according to the embodiment of the present invention.

FIG. 9 is a flowchart illustrating an application example of the context-based adaptive binary arithmetic decoding method according to the embodiment of the present invention. The context-based adaptive binary arithmetic decoding method is described with reference to FIGS. 4, 5, and 9.

First, an initial LPS probability value is loaded from the first ROM table 440 to the data loading unit 532 of the general mode arithmetic decoder 460 (operation S910). Operation S910 is performed to decode the first and second binary values. As described above, the H.264/MPEG-4 pt. 10 AVC codec arithmetic decoder uses a different context for a first binary value, from contexts used for the remaining binary values. Accordingly, since decoding of the first and binary values is initial decoding, an initial probability value should be loaded from the first ROM table 440.

Next, since a third binary value uses the same context as that used when the second binary value of a residue is decoded, a next LPS probability value, a next LPS state value, and a renormalization vector are loaded from the second ROM table 450 to the data loading unit 532 of the general mode arithmetic decoder 460 (operation S920).

Simultaneously with operation S920, general mode arithmetic decoding is performed by the general mode arithmetic decoder 460 (operation S930).

The general mode arithmetic decoding is described in detail below. First, one of predicted probability values and state values previously loaded is selected, as described above with reference to FIG. 5. The H.264/MPEG-4 pt. 10 AVC codec arithmetic decoder selects one of four quantized current probability values within a predetermined range of current probability values, according to each state value. Quantization is to read 2 bits from a MSB of a current probability value and map it to one of 0, 1, 2, and 3. Accordingly, the predicted probability information register array unit 510 is indexed according to the 2 bits of MSB. Since a next state value is determined according to whether a previously decoded binary value is a MPS or a LPS, a next state value can be loaded by indexing a MPS flag register corresponding to previously decoded MPS information. As such, by updating registers, predicted probability information can be loaded on the basis of updated values. Therefore, pipeline processing of decoding a current binary value on the basis of register values for simultaneously updated current probability information is possible.

Then, it is determined whether the number of up-to-now decoded symbols is below 14 (operation S940).

If it is determined in operation S940 that the number of the decoded symbols is below 14, operation S950 is performed. Meanwhile, if the number of the decoded symbols is equal to or more than 14, operation S960 is performed. The case where the number of the decoded symbols is equal to or more than 14 means that all binary values of the up-to-now decoded symbols are MPSs.

In operation S950, it is determined whether a binary value of a currently decoded symbol is a "0".

If it is determined in operation S950 that a binary value of a currently decoded symbol is not a "0", operations S920 and S930 are performed. On the contrary, if it is determined that the binary value of the currently decoded symbol is a "0", the process is terminated.

If it is determined in operation S940 that the number of the up-to-now decoded symbols is equal to or more than 14, the process proceeds to operation S960 in which bypass mode arithmetic decoding is performed.

During the bypass mode arithmetic decoding, only a current value changes without the current probability value changing. The EG0 code described above with reference to FIG. 7 has a successive series of "1" before "0" first appears. That is, MPSs successively appear, a LPS appears at a predetermined time, and thereafter MPSs and LPSs appear mixedly. Accordingly, to detect a first generation location of a LPS, a plurality of symbols are simultaneously calculated and "0" first generated is selected. Such parallel processing is performed on the basis of the characteristic of the EG0 code and the characteristic of the bypass mode, considering a fact that a current probability value does not change. Accordingly, a value changing from a MPS to a LPS is generalized (see 622n of FIG. 6). Then, a candidate LPS binary value is output to the multiplexer 630 and the multiplexer 630 selects a value and a binary value outputting "0". Values output by the parallel processing are values before a first LPS generation position and then the remaining binary symbols are decoded. The remaining bit arithmetic decoder 640 of FIG. 6 decodes the remaining binary symbols after the first LPS generation position.

FIG. 10 illustrates a ROM table for loading initial data, according to an embodiment of the present invention.

Referring to FIG. 10, if the first ROM table 440 is indexed by an address for a current state value, four quantized probability values are loaded. The first ROM table 440 includes the four probability values and renormalization vectors. The renormalization vectors are provided to remove while loops during a renormalization process, where the renormalization process is performed to allow decoding in units of bits according to precision of a given decoder. However, since while loops are performed according to a current probability value, it is difficult to implement a suitable hardware. In the conventional arithmetic decoder, the renormalization process is performed by periodically checking the generation of while loops. However, the H.264/MPEG-4 pt. 10 AVC codec arithmetic decoder can predict the number of while loops to be performed, using a table including probability values. Accordingly, while loops can be removed by using the renormalization vector.

The renormalization vector can be used only when a currently decoded binary value is a LPS. Since the number of while loops to be performed can be predicted by a MSB of a current probability value if the currently decoded binary value is a MPS, mapping to the first ROM table 440 is not required. However, if the currently decoded binary value is a LPS, since the number of while loops to be performed should be separately calculated, the value is mapped to the first ROM table 440 according to the current probability value without a separate process.

Figure 11:
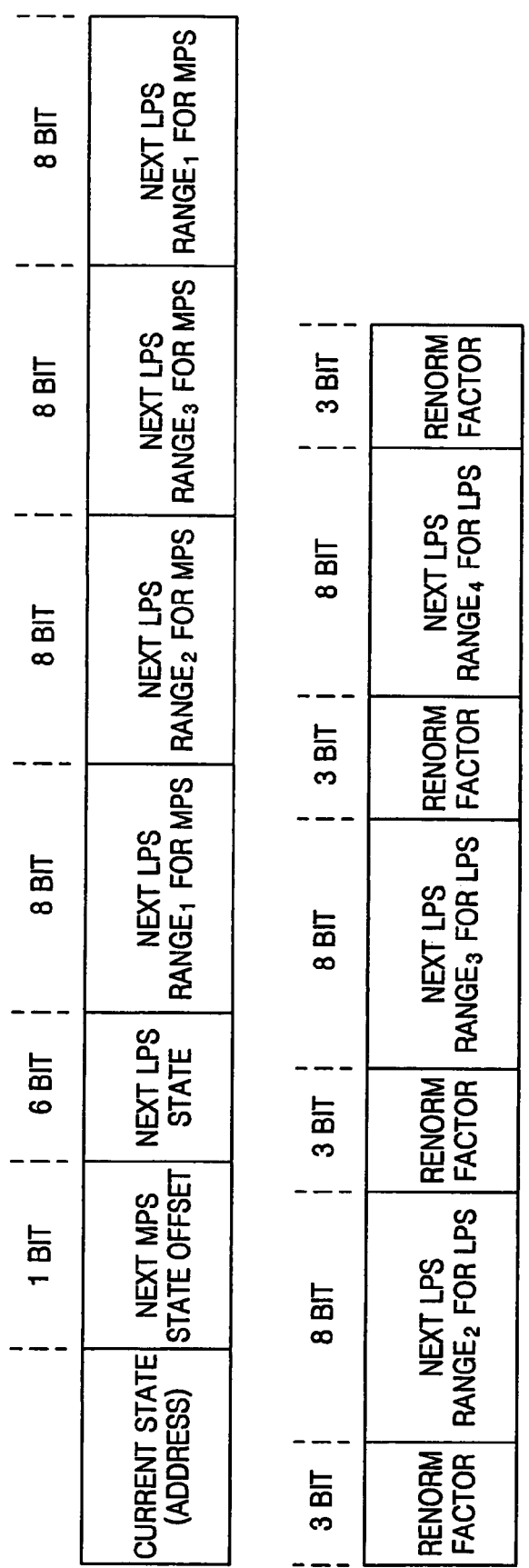
FIG. 11 illustrates a ROM table for loading prediction data, according to an embodiment of the present invention.

FIG. 11 illustrates a ROM table for loading prediction data, according to an embodiment of the present invention.

Like the first ROM table 440, the second ROM table 450 stores probability values. However, the second ROM table 450 stores a probability value and a next state value of when a previously decoded binary value is a MPS and a probability value and a next state value of when a previously decoded binary value is a LPS.

If a next binary value to be decoded is a MPS, an increased amount of a corresponding state value is "0" or "1". Accordingly, instead of storing a next state value, a next MPS state value offset (1 bit) corresponding to the increased amount is stored.

Meanwhile, if a next binary value to be decoded is a LPS, since an increased amount of a corresponding state value is not constant, a next LPS state value (6 bits) is stored.

The present invention can also be embodied as computer readable code on a computer readable recording medium. The computer readable recording medium is any data storage device that can store data which can be thereafter read by a computer system. Examples of the computer readable recording medium include read-only memory (ROM), random-access memory (RAM), CD-ROMs, magnetic tapes, floppy disks, optical data storage devices, and carrier waves. The computer readable recording medium can also be distributed over network coupled computer systems so that the computer readable code is stored and executed in a distributed fashion.

As described above, according to a context-based adaptive binary arithmetic decoding method and apparatus of the present invention, it is possible to implement a hardware suitable for an arithmetic decoder based on a H.264/MPEG-4 pt. 10 AVC standard, thereby reducing the amount of calculations and enhancing a decoding speed. For example, assume that the length of a decoded TU code is L1, the length of an EG0 code is L2, and the number of parallel processing units used in a bypass mode is n. In this case, if a residue value is smaller than 14, in the conventional technique, the number of required calculations is 2×L1. However, by using pipeline processing according to the present invention, the number of required calculations is reduced to L1. Also, if a residue value is equal to or more than 14, both a general mode and a bypass mode are used. In this case, in the conventional technique, the number of required calculations is 26+L2. However, by using pipeline processing and parallel processing according to the present invention, the number of required calculations is reduced to 13+(L2)/(n)+(L2)/(2)−1. Therefore, according to the present invention, it is possible to enhance a decoding speed through the reduction in the amount of calculations.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A context-based adaptive binary arithmetic decoding apparatus for decoding a bit stream generated by arithmetic encoding, comprising:
   a context extractor extracting a plurality of contexts from a storage unit storing contexts each including a state value for probability characteristic;
   a first ROM table storing current probability information so that a current binary symbol of the bit stream is decoded according to a state value of each context;
   a second ROM table storing predicted probability information so that a next binary symbol of the bit stream is decoded according to a state value of each context;
   a general mode arithmetic decoder, which performs pipeline processing, loading current probability information from the first ROM table on the basis of a current state value of a context extracted from the context extractor to decode a first binary symbol, and loading predicted probability information from the second ROM table to decode a next remaining binary symbol while decoding the remaining binary symbols; and
   a bypass mode arithmetic decoder, including a plurality of calculators for parallel processing, simultaneously decoding a plurality of corresponding binary symbols of the bit stream, to perform arithmetic decoding on the remaining symbols if a predetermined condition is satisfied while the general mode arithmetic decoder performs arithmetic decoding on the corresponding symbols of the bit stream.

2. The apparatus of claim 1, further comprising:
   a level counter receiving previously decoded residue values from the general mode arithmetic decoding unit, counting absolute values of the previously decoded residue values, and outputting a level counter signal,
   wherein the context extractor loads the contexts stored in the storage unit, receives the level counter signal from the level counter, and extracts a predetermined context according to the level counter signal.

3. The apparatus of claim 1, wherein the general mode arithmetic decoder comprises:
   a data loading unit loading the current probability information from the first ROM table and loading the predicted probability information from the second ROM table;
   a predicted probability information register array unit storing predicted probability information capable of being output when decoding a next symbol of a bit stream output from the data loading unit;
   a current probability information register unit storing current probability information capable of being output when decoding a current symbol of the bit stream; and
   an arithmetic decoding unit receiving the current probability information from the current probability information register unit and performing arithmetic decoding and renormalization on the basis of the current probability information, thus decoding a corresponding symbol of the bit stream.

4. The apparatus of claim 3, wherein, in the data loading unit, the current probability information loaded from the first ROM table includes a current LPS probability value and a renormalization vector, and the predicted probability information loaded from the second ROM table includes a next LPS probability value and a next LPS state value.

5. The apparatus of claim 4, wherein the predicted probability information register array unit includes a next LPS range register array storing next LPS probability values and a next LPS state register array storing next LPS state values.

6. The apparatus of claim 3, wherein the current probability information register unit comprises:
- a current range register storing a current probability value of a current symbol of the bit stream;
- a MPS flag register storing information for whether a decoded symbol of the bit stream is a MPS (Most Probable Symbol) or a LPS (Least Probable Symbol);
- a current state register storing a current state value of the current symbol of the bit stream; and
- a current value register storing values of up-to-now decoded symbols among symbols of the bit stream, so that it is determined whether a decoded symbol stored in the MPS flag register is a MPS or a LPS on the basis of the values.

7. The apparatus of claim 3, wherein the data loading unit and the arithmetic decoding unit construct a pipeline processing structure.

8. The apparatus of claim 1, wherein the bypass mode arithmetic decoding unit comprises:
- a current probability information register unit storing current probability information including a current probability value and a current value capable of being output when decoding a current symbol of the bit stream;
- a parallel arithmetic decoder, having a parallel processing structure, determining whether each binary value of a plurality of decoded symbols of the bit stream is a MPS or a LPS and performing arithmetic decoding;
- a multiplexer deciding when a binary value of a corresponding symbol of the bit stream changes from a MPS to a LPS by the parallel arithmetic decoder; and
- a remaining bit calculator sequentially decoding remaining symbols not subjected to arithmetic decoding after the binary value of the corresponding symbol of the bit stream changes from the MPS to the LPS.

9. The apparatus of claim 8, wherein the parallel arithmetic decoder comprises:
- a plurality of value calculation units each calculating the current value to determine whether the binary value of the symbol of the bit stream to be decoded is a MPS or a LPS; and
- a plurality of comparing units, each corresponding to a current value calculated by each of the plurality of value calculation units and comparing the current value with the current probability value, thereby determining whether the binary value of the symbol of the bit stream is the MPS or the LPS.

10. The apparatus of claim 9, wherein the plurality of value calculation units and the plurality of comparing units construct a parallel processing structure.

11. The apparatus of claim 1, wherein the first ROM table consists of current probability information including current state values corresponding respectively to the contexts, a plurality of current LPS probability values respectively corresponding to the current state values, and a renormalization vector.

12. The apparatus of claim 1, wherein the second ROM table consists of current state values respectively corresponding to the contexts, a predicted next probability value of when a binary value of a decoded current symbol of the bit stream is a MPS or a LPS, an offset of when a binary value of a next symbol of the bit stream is predicted to a MPS, and a state value of when the binary value of the next symbol of the bit stream is predicted to a LPS.

13. The apparatus of claim 1, wherein the predetermined condition is when 14 successive binary values of decoded symbols of the bit stream are decoded to MPSs.

14. A context-based adaptive binary arithmetic decoding method for decoding a bit stream generated by arithmetic encoding, comprising:
- loading a plurality of contexts each including a state value for probability characteristic;
- loading corresponding current probability information from a first ROM table storing current probability information to decode a first binary symbol of the bit stream according to a state value of each of the loaded contexts;
- loading corresponding predicted probability information from a second ROM table storing predicted probability information to decode a next binary symbol of the bit stream according to a loaded state value;
- decoding a first binary symbol on the basis of the current probability information loaded from the first ROM table and loading predicted probability information from the second ROM table to decode next remaining binary symbols while decoding current remaining binary symbols;
- determining whether a binary value of a decoded symbol of the bit stream satisfies a predetermined condition while decoding the first binary symbol;
- if it is determined that the current binary symbol of the bit stream satisfies the predetermined condition, simultaneously decoding a plurality of non-decoded binary symbols among binary symbols of the bit stream by a plurality of calculators and calculating a time of when a binary symbol of the bit stream is first output as a LPS; and
- after the binary symbol of the bit stream is first output as the LPS, decoding corresponding non-decoded remaining symbols.

15. The method of claim 14, wherein, decoding of the current symbol of the bit stream and receiving of the prediction probability information from the second ROM table are pipeline-processed.

16. The method of claim 14, wherein the plurality of calculators construct a parallel processing structure.

17. The method of claim 14, wherein, when 14 successive binary values of decoded symbols of the bit stream are decoded to MPSs, it is determined that the current binary symbol of the bit stream satisfies the predetermined condition.

18. The method of claim 14, wherein a plurality of contexts extracted from a storage unit storing contexts including state values for probability characteristic are loaded.

19. A computer-readable medium having embodied thereon a computer program for executing the method of claim 14.

20. An apparatus for implementing context-based adaptive arithmetic decoding, comprising:
- a storage unit storing contexts, each context including a state value for probability characteristic;
- a context extractor extracting contexts from the storage unit;
- a first ROM table storing current probability information;
- a second ROM table storing predicted probability information;
- a general mode arithmetic decoder, which performs pipeline processing, loading current probability information from the first ROM table and loading predicted probability information from the second ROM table;
- a bypass mode arithmetic decoder, including a plurality of calculators for parallel processing, simultaneously decoding a plurality of corresponding binary symbols of the bit stream, to perform arithmetic decoding on the remaining symbols; and a level counter receiving values from the general mode arithmetic decoding unit and outputting a level counter signal, wherein the context extractor loads the contexts stored in the storage unit, receives the level counter signal from the level counter, and extracts a predetermined context according to the level counter signal.

* * * * *